United States Patent [19]

Paparo et al.

[11] Patent Number: 5,072,278
[45] Date of Patent: Dec. 10, 1991

[54] MONOLITHIC INTEGRATED STRUCTURE FOR A TWO-STAGE DRIVING SYSTEM WITH LEVEL TRANSLATOR CIRCUIT COMPONENT OF THE DRIVING SIGNAL FOR POWER TRANSISTORS

[75] Inventors: Mario Paparo, San Giovanni La Punta; Sergio Palara, Acicastello, both of Italy

[73] Assignee: SGS-Thomson Microelectronics s.r.l., Agrate Brianza, Italy

[21] Appl. No.: 480,162

[22] Filed: Feb. 14, 1990

[30] Foreign Application Priority Data

Feb. 27, 1989 [IT] Italy .................... 19570 A/89

[51] Int. Cl.$^5$ ............................. H01L 27/02
[52] U.S. Cl. ........................ 357/43; 357/41; 357/40
[58] Field of Search ............ 357/40, 42, 52, 43, 357/41

[56] References Cited

U.S. PATENT DOCUMENTS 4,742,377  5/1988  Einthoven ................. 357/52 X
4,862,242  8/1989  Wildi et al. ............... 357/52 X

*Primary Examiner*—Rolf Hille
*Assistant Examiner*—Ray Potter
*Attorney, Agent, or Firm*—Sixbey, Friedman, Leedom & Ferguson

[57] ABSTRACT

The monolithic integrated structure comprises a semiconductor substrate, a superimposed first epitaxial stratum having characteristics such as to withstand a high supply voltage applied to the driving system and a first and a second isolation pocket which may be connected to a high voltage and to ground, respectively, and diffused in said first epitaxial stratum at a distance such as to define an interposed area of said first stratum capable of isolating said isolating pockets from one another. Within the latter pockets, there are provided respective embedded strata and superimposed regions of a second epitaxial stratum having characteristics such as to withstand the low voltage applied across the two driving stages. A further region of said second epitaxial stratum is superimposed over said area of said first epitaxial stratum. The above regions of isolation pockets are designed for the formation of two high and low voltage driving stages, while the above further region of the second epitaxial stratum may be used for the formation of a level translator circuit component. Means are provided for the protection of said circuit component against high supply voltages.

13 Claims, 4 Drawing Sheets

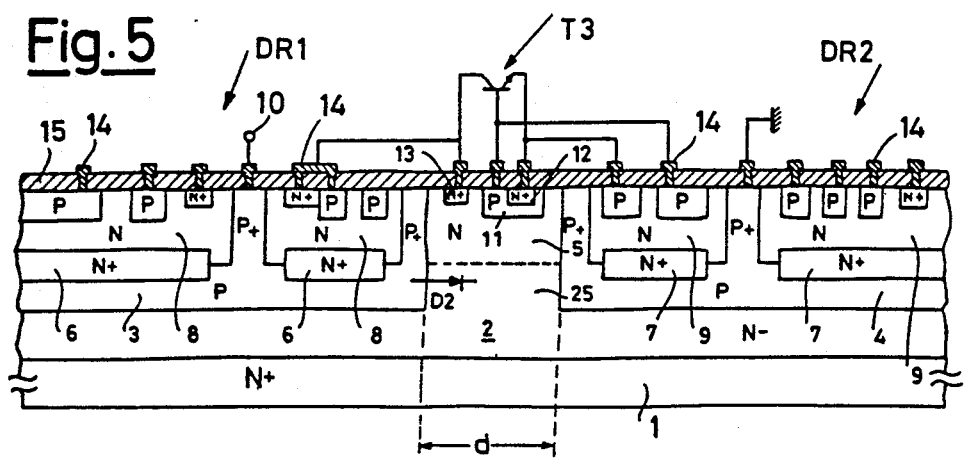
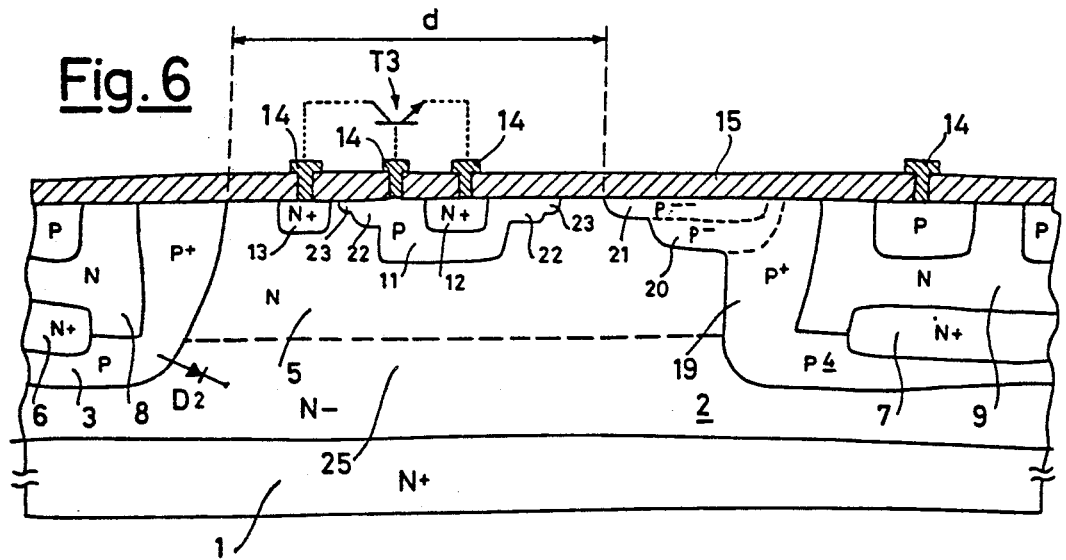
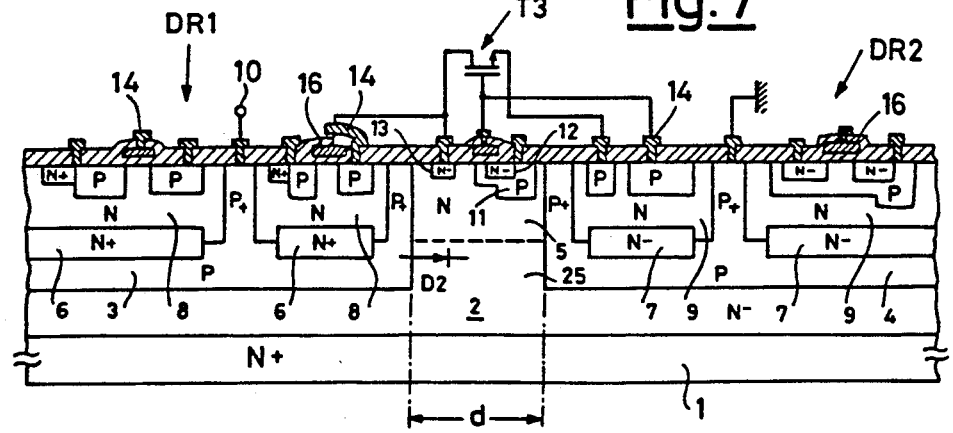

MONOLITHIC INTEGRATED STRUCTURE FOR A TWO-STAGE DRIVING SYSTEM WITH LEVEL TRANSLATOR CIRCUIT COMPONENT OF THE DRIVING SIGNAL FOR POWER TRANSISTORS

DESCRIPTION

The present invention relates to a monolithic integrated structure for a two-stage driving system with level translator circuit component of the driving signal for power transistors, particularly for half-bridge circuits.

In the field of power electronics the drive of transistors in a half-bridge circuit subjected to high voltages (about 500 volts) usually requires the use of two driving stages, one of which, called "upper stage", can reach a substrate voltage referred to ground equal to the high supply voltage, while the other, defined "lower stage", may be supplied at a lower voltage (say, from 10 to 15 volts).

In a driving system of this type, if the control signal is applied at the lower stage, it must be possible to drive the upper stage as well by means of the same signal or by a manipulation thereof.

An electrical connection must therefore be provided between the two stages which is capable of transferring the driving signal from the lower stage to the upper, and such electrical connection must obviously be accomplished with a circuit component (say, a transistor) capable of withstanding the high voltage in question.

If it is desired to proceed to the integrated accomplishment of the driving system on a single chip, this is possible with the known art by utilizing a high voltage technology on a semiconductor substrate of type P. In this way, however, all the circuit components of the system, including those subjected to very low voltages such as the internal components of the two driving stages, are manufactured so as to withstand high voltages. This is uneconomical, as it is known that a component accomplished with a high voltage technology occupies an area of semiconductor material which is much greater than that of a component accomplished with a low voltage technology due to the square dependance of size on operating voltage.

The object of the present invention is now to accomplish a monolithic integrated structure for a two-stage driving system with level translator circuit component of the driving signal for power transistors, which utilizes a low voltage technology for all the components internal to the two driving stages.

According to the invention such object is accomplished with a monolithic integrated structure characterized in that it comprises a semiconductor substrate, a superimposed first epitaxial stratum having characteristics such as to withstand a high supply voltage applied to the driving system, a first and a second isolation pocket implanted and diffused in said first epitaxial stratum at a distance such as to define an interposed area of said first stratum capable of isolating said isolating pockets from one another and, within the latter, respective embedded strata and superimposed regions of a second epitaxial stratum having characteristics such as to withstand a low voltage applied across the two driving stages, and a further region of said second epitaxial stratum superimposed over said area of said first epitaxial stratum, said regions of said isolation pockets being designed for the formation of the two driving stages, respectively, and said further region being designed for the formation of the level translator circuit component, there being provided means for the protection of said circuit component against the high supply voltage.

There is accomplished a monolithic integrated structure, which allows the level translator circuit component to withstand the high voltages to which it is subjected and, at the same time, permits the formation of the internal components of the two driving stages with a low voltage technology. The latter thus have a reduced size and the monolithic structure is consequently compact and inexpensive.

Some possible embodiments of the present invention are illustrated for greater clarity, merely as an example, in the enclosed drawings, wherein:

FIG. 5 shows a schematic cross-sectional view of the essential part of a monolithic integrated structure according to the invention, which accomplishes a circuit diagram with bipolar components of the type illustrated in FIGS. 1 and 3;

FIG. 6 shows a further cross-sectional view, but on an enlarged scale and in greater detail, of the central part of the structure of FIG. 5, where there is formed a level translator circuit component interposed between the two driving stages;

FIG. 7 shows a schematic cross-sectional view of the essential part of a monolithic integrated structure according to the invention, which accomplishes a circuit diagram with MOS components of the type illustrated in FIGS. 2 and 4;

Figure 1:
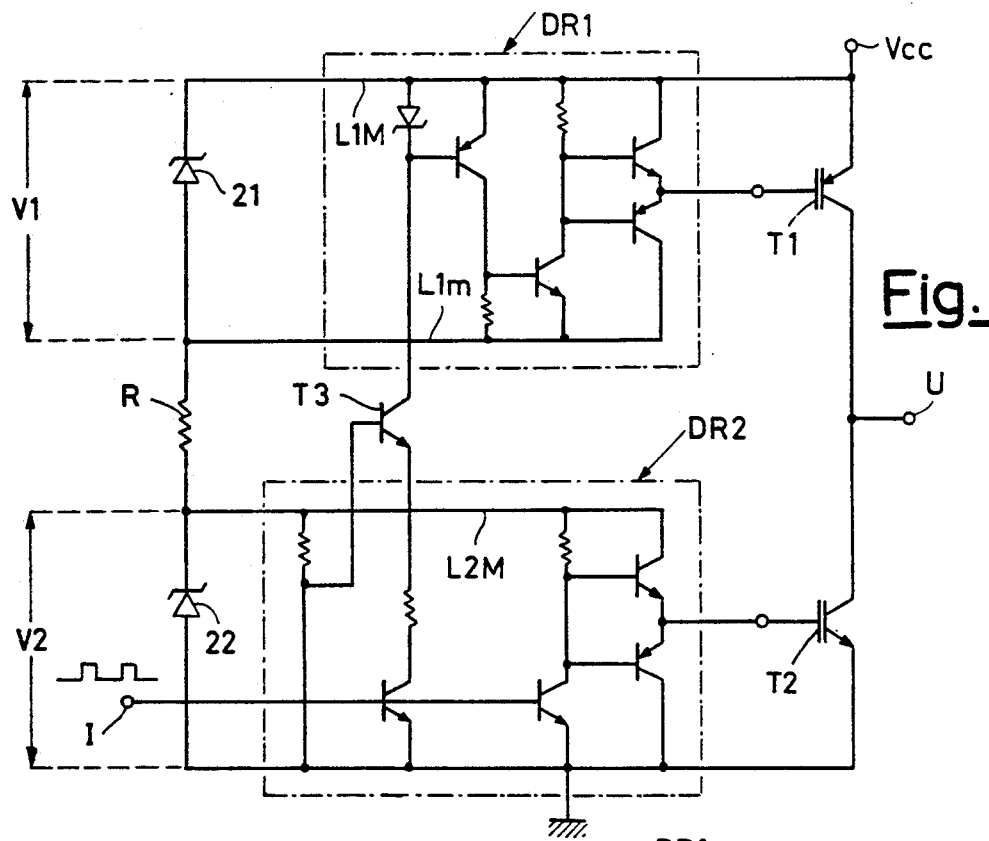
FIG. 1 shows the circuit diagram of a two-stage driving system with bipolar components for a half-bridge circuit with type IGBT power transistors, the upper being a p-channel type, the lower an n-channel type.

There is shown in FIG. 1 a half-bridge circuit formed by two power transistors T1 and T2 connected in series between a high voltage power supply Vcc (say, 500 volts) and ground. Output U of the half-bridge is obtained by an intermediate branch point between transistors T1 and T2. In the illustrated example, the latter are constituted by two IGBT (Insulated Gate Bipolar Transistors) transistors of the p-channel and n-channel types, respectively.

The gate drive of the two power transistors T1 and T2 is provided by respective upper and lower driving stages DR1 and DR2 formed by bipolar components variously arranged, for the DR1 stage, between an upper line L1M at a higher voltage connected to the Vcc power supply and a lower line L1m at a lower voltage and, for the DR2 stage, between an upper line L2M at a higher voltage and ground.

Externally to the two driving stages DR1 and DR2, a zener diode Z1 connects line L1M to line L1m, a resistance R connects line L1m to line L2M and a zener diode Z2 connects line L2M to ground.

The lower driving stage DR2 has an input I for a suitable driving signal. A transistor T3 is connected between the two driving stages DR1 and DR2 to operate the level translation of the driving signal from the lower stage DR2 to the upper stage DR1.

Due to the effect of the described structure the upper driving stage DR1 is driven directly by the high voltage Vcc and the circuit components inside such stage are subjected to a maximum voltage across their terminals which is less than or equal to the zener voltage V1 of zener diode Z1 (for example, V1=12 volts).

The current absorbed by the upper stage DR1 passes mainly through resistance R and goes to supply the lower stage DR2, whose maximum supply voltage is less than or equal to the zener voltage V2 of zener diode Z2 (for example, V2=12 volts).

A small part of the current also passes through transistor T3, which must obviously be capable of withstanding the high voltage between terminal Vcc and ground. Modulation of the current flowing through T3 allows the desired level translation between lower stage DR2 and upper stage DR1.

Resistance R also withstands a high voltage, equal to Vcc−(V1+V2).

Figure 2:
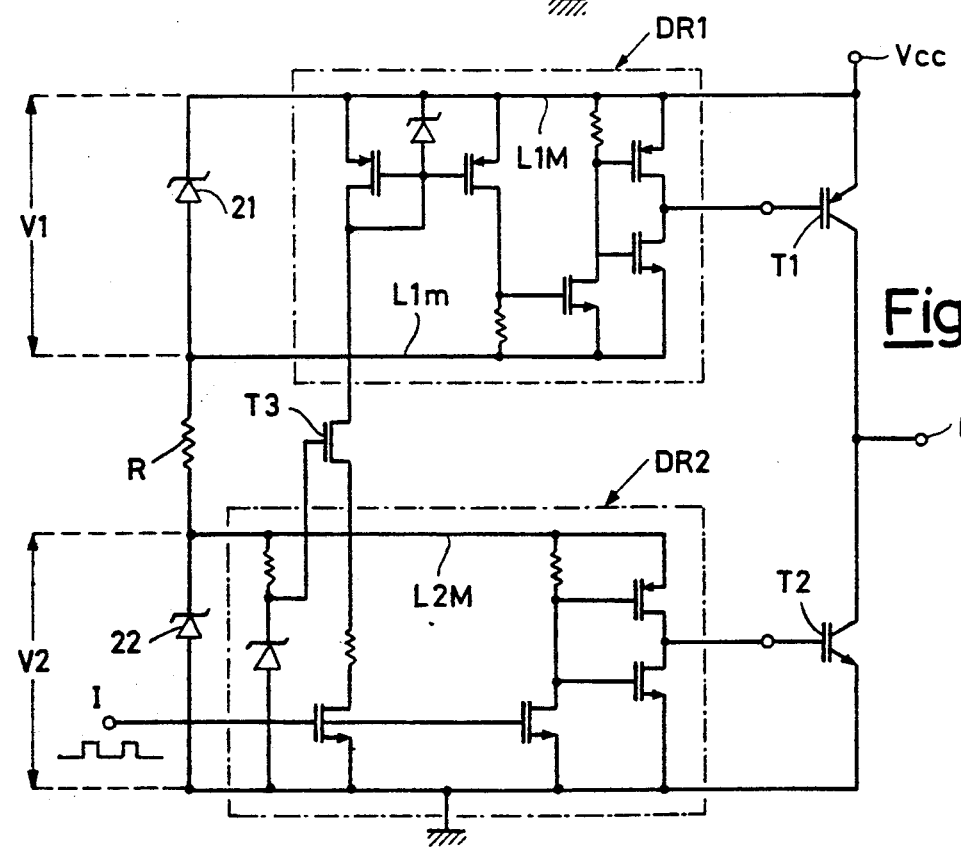
FIG. 2 shows the circuit diagram of a similar driving system accomplished with MOS components.

The general diagram of the driving system of FIG. 2 is similar to that of FIG. 1, since the two power transistors T1 and T2 have remained identical. The only change is the type of internal component utilized for the two driving stages DR1 and DR2, which this time is of the MOS type. The external connections of the driving stages and the mode of operation of the entire system remain unaltered.

Figure 3:
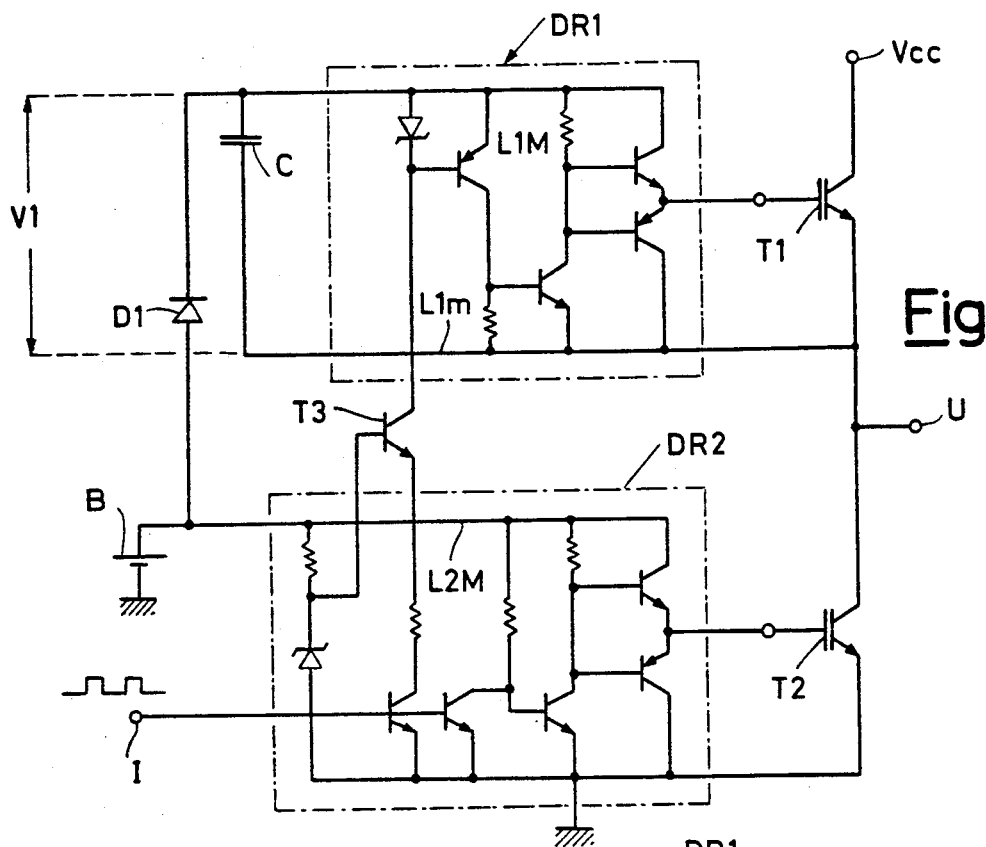
FIG. 3 shows the circuit diagram of a two-stage driving system with bipolar components for a half-bridge circuit with type IGBT power transistors, both of the n-channel type.

FIG. 3, however, shows a half-bridge circuit wherein the two power transistors T1 and T2 are both of the n-channel IGBT type. The diagram of the internal circuit of the upper driving stage DR1 has remained identical to that of FIG. 1 and that of thw lower driving stage DR2 has changed very little, but the upper line L1M of upper stage DR1 is now supplied by a battery B through a diode D1 and is connected to the lower line L1m of the same stage DR1 through a bootstrap capacity C, and the upper line L2M of lower stage DR2 is supplied directly by battery B.

In this case the upper stage DR1 is thus supplied with a voltage V1=VB−VBED1, where VB is the voltage produced by battery B and VBED1 is the voltage drop across diode D1. The lower stage DR2 is in turn supplied by a voltage V2=VB. The upper stage DR1 is floating and follows the voltage at output U. Line L1M varies between Vcc+V1 and V1, but the voltage V1 across stage DR1 remains equal to VB−VBED1.

This implies that the level translator transistor T3 is subjected to a voltage variable between Vcc+V1 and ground. This is another case wherein it must also be able to withstand high voltages.

Figure 4:
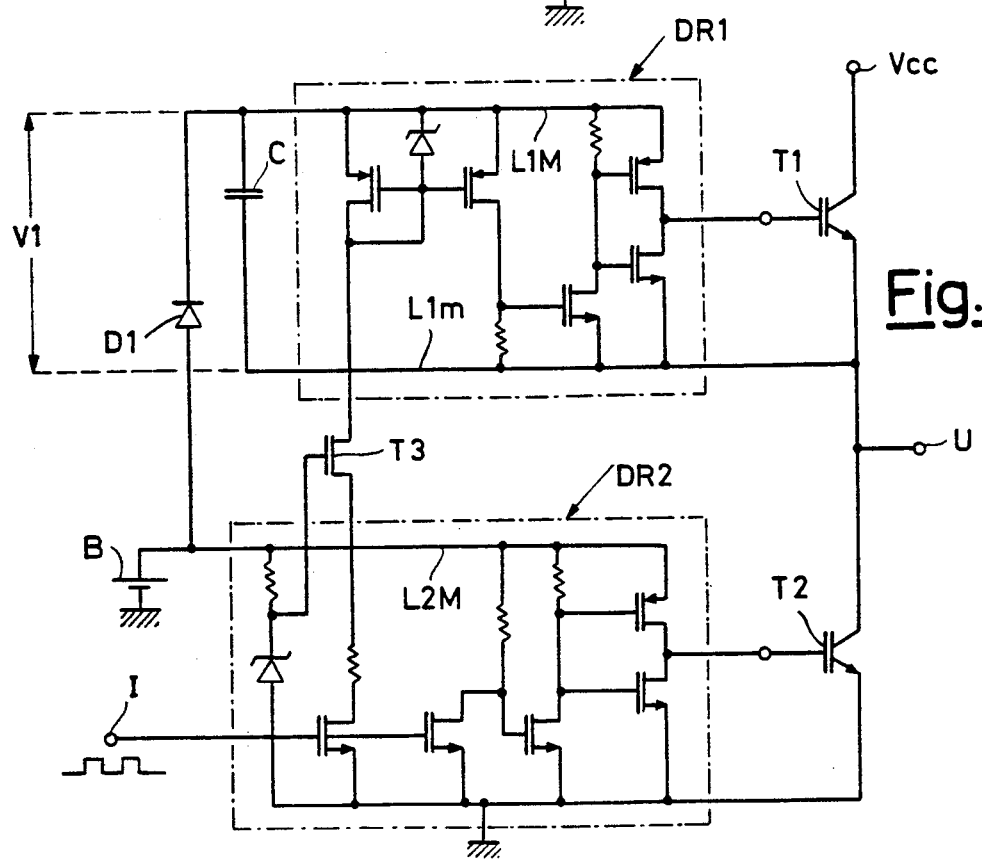
FIG. 4 shows the circuit diagram of a similar driving system accomplished with MOS components.

The general diagram of the driving system of FIG. 4 finally reproduces that of FIG. 3, but utilizing MOS type integrated components as in the case of FIG. 2. The external connections of the driving stages and the mode of operation of the system remain unaltered.

With the present invention it is possible to integrate the two driving stages DR1 and DR2 and the level translator transistor T3 of any and all of the driving systems shown as an example in FIGS. 1-4, as well as of any other driving system for power transistors included in a half-bridge circuit, in a single monolithic structure, that is, on a single chip, which includes the two driving stages in parts accomplished with a low voltage technology and the level translator transistor in a part accomplished with a high voltage technology.

FIGS. 5 and 6 refer to the monolithic integrated structure of the driving systems having bipolar components illustrated in FIGS. 1 and 3.

The above figures show a substrate 1 of silicon of type N+, on which there is superimposed a first epitaxial stratum 2 of type N− having characteristics such as to withstand the maximum power supply voltage applied to the driving system (say, 500 volts).

On the epitaxial stratum 2 there have been implanted and diffused two separate isolation pockets 3 and 4 arranged at a distance "d" such as to define an interposed area 25 of the epitaxial stratum 2. The above distance and the doping of area 25 are selected so as to isolate said isolation pockets 3 and 4 from one another.

Inside isolation pockets 3 and 4 there are implanted respective embedded strata 6 and 7 of type N+, on which there have been grown respective regions of epitaxial strata 8 and 9 having characteristics such as to withstand the low voltage (say, 20 volts) applied across the two driving stages DR1 and DR2. A similar region of epitaxial stratum 5 has been grown over region 25 of epitaxial stratum 2.

The two low-voltage epitaxial regions 8 and 9 are designed for the formation of the internal components of the two driving stages DR1 and DR2, respectively.

Isolation pocket 3 is connected to a terminal 10 coincident with the lower line L1m of the upper driving stage DR1 and isolation pocket 4 is connected to ground.

During the formation of the internal components of the two driving stages, which is accomplished with known techniques, there is also formed, again with known techniques, the level translator transistor T3, provided with base 11, with emitter 12 and with collector 13 regions. The base and emitter regions of transistor 13 are connected to the lower stage DR2 and the collector region of the same transistor T3 is connected to the upper stage DR1 at a point such as to exclude the conduction of diode D2 formed by isolation pocket 3 and the epitaxial strata 25 and 5. Incidentally, that shown in FIG. 5 must be considered merely as a non-limiting example.

The different connections are accomplished by means of electrical contacts 14 passing through an upper stratum 15 of silicon oxide.

As shown in FIG. 6, isolation pocket 4 of the low voltage driving stage DR2 is, in effect, provided with lateral superficial extensions 20 and 21, with doping P− and P−−, respectively, which are implanted in the epitaxial stratum 5 and completely surround the pocket itself in the way of rings. Said extensions or rings 20 and 21 have the task of holding the voltage of epitaxial stratum 5 with respect to isolation pocket 4 with a ground potential, modifying the lines of the electrical field in the above epitaxial stratum and thus avoiding the breakage of the N-P junction between area 5 and the adjacent area 19 of isolation pocket 4. In the absence of rings 20 and 21 breakage would occur at a voltage which is lower than that applied to the device.

The same FIG. 6 also shows that the base region 11 of transistor T3 is also provided with extensions or rings 22 and 23, whose object is to modify the lines of the electrical field in the epitaxial stratum 5 and avoid the breakage of the N-P junction between area 5 and area 11.

FIG. 7 in turn refers to the monolithic integrated accomplishment of the driving systems having MOS components illustrated in FIGS. 2 and 4.

The differences with respect to the structure of FIG. 5 are very slight and conceptually nonexistent. Simply, as is obvious, there are provided floating gates 16 for the different MOS components. The detail of FIG. 6 is also fully applicable to FIG. 7.

It should be noted that FIGS. 5 and 6 obviously show only a part of the entire monolithic integrated structure which forms the circuits of FIGS. 1-4, more precisely that referring to transistor T3 and to the adjacent extremities of driving stages DR1 and DR2. The remaining part, referring to the driving stages, is in effect considered to be known art, with no inventive content to it.

Figure 8:
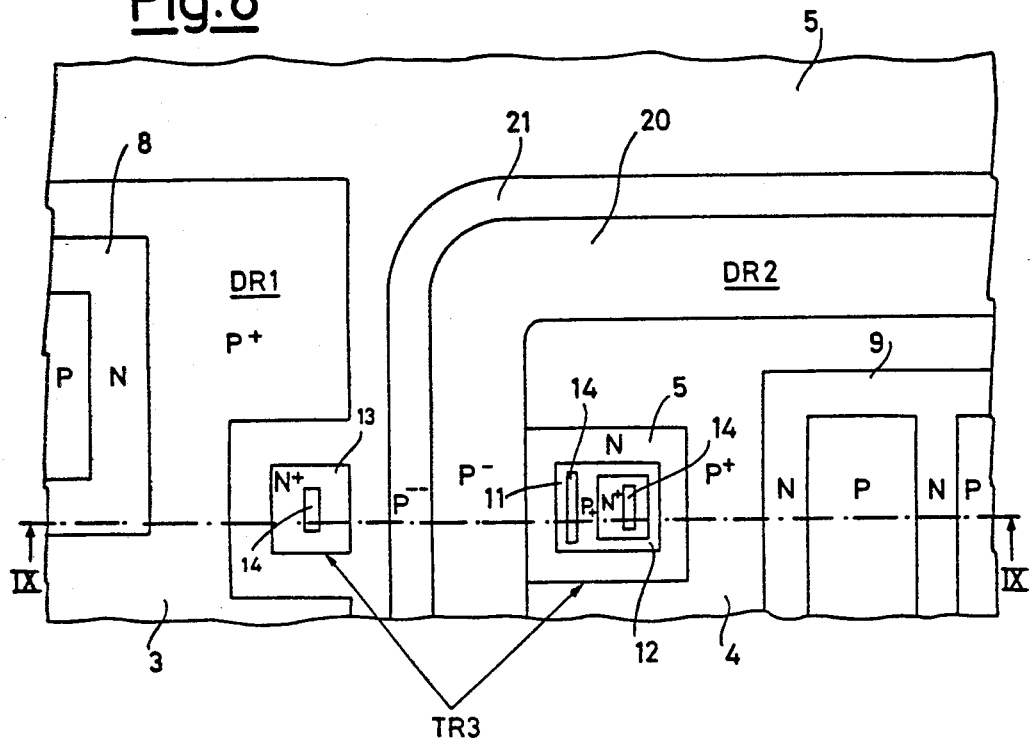
FIGS. 8 and 9 show a plan view from above and a cross-sectional view taken along the line IX—IX of FIG. 8, respectively, of the central part of a different embodiment of a monolithic integrated structure according to the invention for circuit diagrams having bipolar components.
Figure 9:
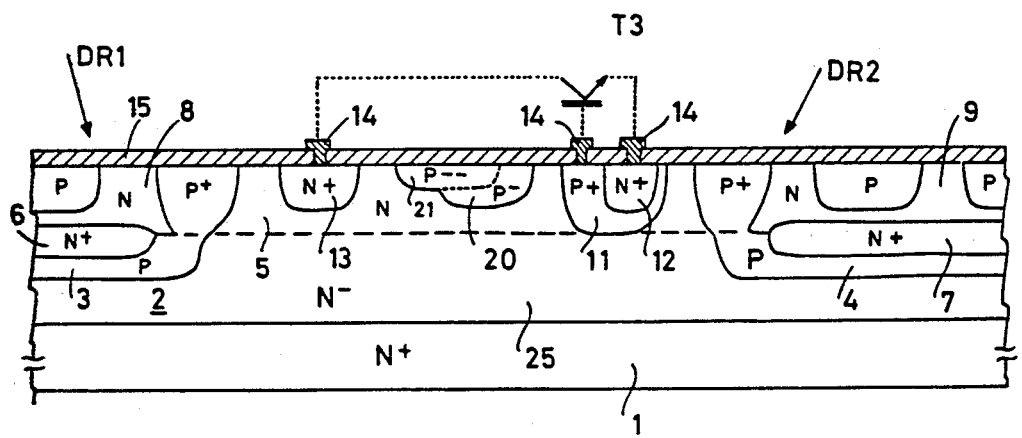

FIGS. 8 and 9 show a variant of the structure of FIG. 6, which has the base 11 and the emitter 12 regions of transistor T3 again arranged outside the isolation pocket 4 but inside the protection rings 20 and 21 which circumscribe the low voltage driving stage DR2. In this case transistor T3 is without its rings 22 and 23 as their protective function is carried out by rings 20 and 21.

That shown in FIGS. 8 and 9, with transistor T3 at the periphery of the area of stage DR2, is a currently preferred embodiment of the present invention. This does not, however, mean that transistor T3 may not be located in a different position, say between one stage and the next as in FIGS. 5-7 or in a more central position of driving stage DR2 or again at any point on the chip. It cannot, on the other hand, be located inside driving stage DR1 because it would be unable to withstand the high voltages in play.

It should finally be noted that, whereas up to now monolithic integrated structures have been described based on components of the bipolar or MOS type, it is also possible to provide for the accomplishment of mixed structures with both bipolar and MOS components.

We claim:

1. A monolithic integrated structure for a two-stage driving system for serially connected power transistors, the driving system including a high voltage stage, a low voltage stage and a level translator circuit component for transferring a driving signal from said low voltage stage to said high voltage stage, the integrated structure comprising a semiconductor substrate, a first epitaxial layer superimposed on said substrate and having conductivity characteristics such as to withstand voltages of at least a first magnitude, first and second isolation pockets formed in said first epitaxial layer at such a mutual distance as to define an intermediate area of said first epitaxial layer which provides for isolation between the isolation pockets, a second epitaxial layer arranged in each isolation pocket and in a further intermediate area between said isolation pockets and above said first epitaxial layer and having conductivity characteristics such as to withstand voltages of at least a second magnitude, less than said first magnitude, doped regions for circuit components of said high voltage stage formed in said second epitaxial layer in said first isolation pocket, doped regions for circuit components of said low voltage stage formed in said second epitaxial layer in said second isolation pocket, doped regions of said level transistor circuit component formed in said second epitaxial layer in said further intermediate area and protecting means for protecting said doped regions of the level translator against high supply voltage.

2. A monolithic integrated structure according to claim 1, wherein said circuit component is accomplished outside the areas of said high voltage stage and said low voltage stage and said protection means is constituted by lateral superficial annular extensions of said circuit component.

3. A monolithic integrated structure according to claim 1, wherein said circuit component is accomplished inside the areas of said low voltage stage, and said protection means is constituted by lateral superficial annular extensions of the insolation pocket of said low voltage stage.

4. A monolithic integrated structure according to claim 3, wherein said low voltage stage includes a periphery and said circuit component is accomplished at the periphery of said low voltage stage, in the proximity of said lateral extensions.

5. A monolithic integrated structure according to claim 1, wherein said substrate comprisis silicon of the type N+.

6. A monolithic integrated structure according to claim 1, wherein the isolation pocket of the high voltage stage is connected to a terminal coincident with the low voltage of stage.

7. A monolithic integrated structure according to claim 1, wherein the isolation pocket of the low voltage stage is connected to ground.

8. A monolithic integrated structure according to claim 1, wherein said level translator circuit component is of the bipolar type.

9. A monolithic integrated structure according to claim 1, wherein said level translator circuit component is of the MOS type.

10. A monolithic integrated structure according to claim 1, wherein said level translator circuit component has its collector connected to said high voltage stage so as to exclude a conduction from a diode between the isolation pocket of the high voltage stage and said epitaxial layer outside the pockets themselves.

11. A monolithic integrated structure according to claim 1, wherein said high voltage stage and said low voltage stage are accomplished with integrated components of the bipolar type.

12. A monolithic integrated structure according to claim 1, wherein said high voltage stage and said low voltage stage are accomplished with integrated components of the MOS type.

13. A monolithic integrated structure according to claim 1, wherein said high voltage stage and said low voltage stage are accomplished with integrated components of the mixed MOS and bipolar types.

* * * * *